(12) United States Patent
Kim et al.

(10) Patent No.: US 9,105,837 B2
(45) Date of Patent: Aug. 11, 2015

(54) BIPOLAR MEMORY CELLS AND MEMORY DEVICES INCLUDING THE SAME

(75) Inventors: Chang-jung Kim, Yongin-si (KR); Young-bae Kim, Seoul (KR); Ji-hyun Hur, Hwaseong-si (KR); Dong-soo Lee, Gunpo-si (KR); Man Chang, Seongnam-si (KR); Chang-bum Lee, Seoul (KR); Seung-ryul Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 237 days.

(21) Appl. No.: 12/929,780

(22) Filed: Feb. 15, 2011

(65) Prior Publication Data

US 2011/0220860 A1 Sep. 15, 2011

(30) Foreign Application Priority Data

Mar. 10, 2010 (KR) ........................ 10-2010-0021391

(51) Int. Cl.
*H01L 47/00* (2006.01)
*H01L 45/00* (2006.01)
*G11C 13/00* (2006.01)
*H01L 27/24* (2006.01)

(52) U.S. Cl.
CPC .......... *H01L 45/085* (2013.01); *G11C 13/0007* (2013.01); *G11C 13/0069* (2013.01); *H01L 27/2481* (2013.01); *H01L 45/08* (2013.01); *H01L 45/1233* (2013.01); *H01L 45/1266* (2013.01); *H01L 45/146* (2013.01); *H01L 45/147* (2013.01); *H01L 45/1608* (2013.01); *H01L 45/1675* (2013.01); *G11C 2013/0073* (2013.01); *G11C 2213/56* (2013.01); *G11C 2213/71* (2013.01); *G11C 2213/77* (2013.01)

(58) Field of Classification Search
CPC ..................................... G11C 13/0007
USPC ....................... 257/3, 4, E45.002, 5
See application file for complete search history.

(56) References Cited

U.S. PATENT DOCUMENTS

| 7,633,790 B2 | 12/2009 | Rinerson et al. | |
| 7,902,537 B2* | 3/2011 | Schricker et al. | ................. 257/2 |
| 8,022,502 B2 | 9/2011 | Kanzawa et al. | |

(Continued)

FOREIGN PATENT DOCUMENTS

| CN | 101542730 A | 9/2009 |
| EP | 2063467 A1 | 5/2009 |

(Continued)

OTHER PUBLICATIONS

European Search Report dated Jan. 10, 2013, issued in European Application No. 11157516.3.

(Continued)

*Primary Examiner* — Jerome Jackson, Jr.
*Assistant Examiner* — Paul Budd
(74) *Attorney, Agent, or Firm* — Harness, Dickey & Pierce, P.L.C.

(57) ABSTRACT

Bipolar memory cells and a memory device including the same are provided, the bipolar memory cells include two bipolar memory layers having opposite programming directions. The two bipolar memory layers may be connected to each other via an intermediate electrode interposed therebetween. The two bipolar memory layers may have the same structure or opposite structures.

17 Claims, 8 Drawing Sheets

(56) References Cited

U.S. PATENT DOCUMENTS

| | | | |
|---|---|---|---|
| 8,101,937 B2* | 1/2012 | Chiang | 257/2 |
| 8,106,375 B2* | 1/2012 | Chen et al. | 257/4 |
| 8,445,319 B2 | 5/2013 | Kanzawa et al. | |
| 2006/0245243 A1* | 11/2006 | Rinerson et al. | 365/171 |
| 2008/0185573 A1* | 8/2008 | Sun et al. | 257/4 |
| 2008/0273370 A1* | 11/2008 | Keller et al. | 365/148 |
| 2008/0296550 A1* | 12/2008 | Lee et al. | 257/2 |
| 2009/0026433 A1* | 1/2009 | Chiang | 257/2 |
| 2009/0095985 A1 | 4/2009 | Lee et al. | |
| 2009/0224224 A1* | 9/2009 | Fujii et al. | 257/2 |
| 2009/0257267 A1 | 10/2009 | Scheuerlein | |
| 2009/0283736 A1 | 11/2009 | Kanzawa et al. | |
| 2010/0224849 A1* | 9/2010 | Kang | 257/4 |
| 2011/0031465 A1* | 2/2011 | Mitani et al. | 257/4 |
| 2011/0294259 A1 | 12/2011 | Kanzawa | |

FOREIGN PATENT DOCUMENTS

| | | |
|---|---|---|
| JP | 2008034809 A | 2/2008 |
| JP | 2008118022 A | 5/2008 |
| KR | 2004-0104967 A | 12/2004 |
| KR | 2009-0018504 A | 2/2009 |
| KR | 20090045653 A | 5/2009 |
| KR | 20090118454 A | 11/2009 |
| KR | 2010-0024800 A | 3/2010 |

OTHER PUBLICATIONS

M. Terai, et al., "Resistance Controllability of $Ta_2O_5/TiO_2$ Stack ReRAM for Low-Voltage and Multilevel Operation," *IEEE Electron Device Letters*, vol. 31, No. 3, pp. 204-206 (Mar. 2010).
Chinese Office Action dated Feb. 25, 2014 issued in corresponding Chinese Application No. 201110059136.6.

* cited by examiner

BIPOLAR MEMORY CELLS AND MEMORY DEVICES INCLUDING THE SAME

CROSS-REFERENCE TO RELATED APPLICATIONS

This application claims priority under 35 U.S.C. §119 from Korean Patent Application No. 10-2010-0021391, filed on Mar. 10, 2010, in the Korean Intellectual Property Office, the disclosures of which are incorporated herein in their entirety by reference.

BACKGROUND

1. Field

Example embodiments relate to bipolar memory cells and memory devices including the same. Example embodiments relate to methods of manufacturing and operating a memory device including bipolar memory cells.

2. Description of the Related Art

Resistive memory devices operate based on a resistance change of a material (e.g., a transition metal oxide) of which resistance is significantly changed at a specific voltage. That is, the resistance of a resistance-change material decreases when a voltage greater than, or equal to, a set voltage is applied thereto. This refers to an ON state. In addition, the resistance of the resistance-change material increases when a voltage greater than, or equal to, a reset voltage is applied thereto. This refers to an OFF state.

Generally, a resistive memory device includes a storage node having a resistance-change layer and a switching device electrically connected to the storage node. The switching device controls signal access to the storage node.

The need for high integration and/or high performance of various non-volatile memory devices such as the resistive memory devices described above has increased.

SUMMARY

Example embodiments relate to bipolar memory cells and memory devices including the same. Example embodiments relate to methods of manufacturing and operating a memory device including bipolar memory cells.

Provided are a memory cell that exhibits excellent performance and may be highly integrated, and a memory device including the same.

Provided are also methods of manufacturing of operating the memory device.

Additional aspects will be set forth in part in the description which follows and, in part, will be apparent from the description, or may be learned by practice of the presented example embodiments.

According to example embodiments, a memory cell includes a first bipolar memory layer, and a second bipolar memory layer connected to the first bipolar memory layer, wherein the first and second bipolar memory layers have opposite programming directions. The memory cell may be a bipolar memory cell.

Set and reset voltages of the first bipolar memory layer may be positive and negative voltages respectively, and set and reset voltages of the second bipolar memory layer may be negative and positive voltages respectively. An absolute value of the reset voltage of the first bipolar memory layer may be greater than, or equal to, that of the set voltage thereof, and an absolute value of the reset voltage of the second bipolar memory layer may be greater than, or equal to, that of the set voltage thereof.

The second bipolar memory layer may have a structure, which is the same as that of the first bipolar memory layer, or an inversed structure of the first bipolar memory layer. The first bipolar memory layer may be disposed between a first electrode and an intermediate electrode, and the second bipolar memory layer may be disposed between the intermediate electrode and a second electrode.

The first bipolar memory layer may include a first base layer and a first active layer, and the second bipolar memory layer may include a second base layer and a second active layer, wherein the first and second base layers are disposed closer to the intermediate electrode than the first and second active layers, or vice-versa.

The intermediate electrode may be an ion source layer, or the first and second electrodes are ion source layers.

At least one of the first and second bipolar memory layers may include a metal oxide. The metal oxide may include at least one material selected from the group consisting of Ti oxide, Ni oxide, Cu oxide, Co oxide, Hf oxide, Zr oxide, Zn oxide, W oxide, Nb oxide, Ti—Ni oxide, Li—Ni oxide, Al oxide, In—Zn oxide, V oxide, Sr—Zr oxide, Sr—Ti oxide, Cr oxide, Fe oxide, Ta oxide, Pr—Ca—Mn—O (PCMO) and combinations thereof.

The first memory cell may have a bi-directional switching characteristic, and the cross-point memory device may be configured to operate without an additional element having a switching characteristic.

According to example embodiments, a cross-point memory device includes a plurality of first electrodes that have a wire shape and are aligned parallel to each other, and a plurality of second electrodes that have a wire shape and are aligned parallel to each other so as to cross the plurality of first electrodes. A first memory cell is positioned at each cross-point between the first electrodes and the second electrodes. The first memory cell may include a first and a second bipolar memory layer that are sequentially stacked. The first and second bipolar memory layers have opposite programming directions.

Set and reset voltages of the first bipolar memory layer may have signs that are opposite to those of set and reset voltages of the second bipolar memory layer. An absolute value of the reset voltage of the first bipolar memory layer may be greater than, or equal to, that of the set voltage of the second bipolar memory layer, and an absolute value of the reset voltage of the second bipolar memory layer may be greater than, or equal to, that of the set voltage of the first bipolar memory layer.

The first and second bipolar memory layers may have a single- or multi-layer structure. The first and second bipolar memory layers may have a multi-layer structure, and the second bipolar memory layer has an inversed structure of the first bipolar memory layer.

An intermediate electrode is disposed between the first bipolar memory layer and the second bipolar memory layer. The intermediate electrode may be an ion source layer, or the first and second electrodes are ion source layers.

At least one of the first and second bipolar memory layers may include a metal oxide. The metal oxide may include at least one selected from the group consisting of Ti oxide, Ni oxide, Cu oxide, Co oxide, Hf oxide, Zr oxide, Zn oxide, W oxide, Nb oxide, Ti—Ni oxide, Li—Ni oxide, Al oxide, In—Zn oxide, V oxide, Sr—Zr oxide, Sr—Ti oxide, Cr oxide, Fe oxide, Ta oxide, Pr—Ca—Mn—O (PCMO) and combinations thereof.

The cross-point memory device may further include a plurality of third electrodes that have a wire shape and are aligned parallel to each other so as to cross the plurality of second electrodes, and a second memory cell positioned at each cross-point between the second electrodes and the third electrodes. The second memory cell may include a third and a fourth bipolar memory layer that are sequentially stacked. The third and fourth bipolar memory layers have opposite programming directions.

The third bipolar memory layer may have a programming direction that is the same as that of the first bipolar memory layer, and the fourth bipolar memory layer has a programming direction that is the same as that of the second bipolar memory layer. The third bipolar memory layer may have a programming direction that is opposite to that of the first bipolar memory layer, and the fourth bipolar memory layer has a programming direction that is opposite to that of the second bipolar memory layer.

The first memory cell and the second memory cell may each have a bi-directional switching characteristic, and the cross-point memory device may be configured to operate without an additional element having a switching characteristic.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
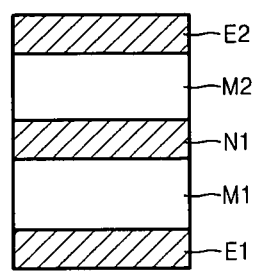
FIGS. 1 through 3 are cross-sectional views illustrating bipolar memory cells according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Example embodiments relate to bipolar memory cells and memory devices including the same. Example embodiments relate to methods of manufacturing and operating a memory device including bipolar memory cells.

FIG. 1 is a cross-sectional view illustrating a bipolar memory cell according to example embodiments.

Referring to FIG. 1, the bipolar memory cell may include first and second bipolar memory layers M1 and M2 that are connected to each other. The first bipolar memory layer M1 may be disposed between a first electrode E1 and an intermediate electrode N1, and the second bipolar memory layer M2 may be disposed between the intermediate electrode N1 and a second electrode E2. In other words, the first bipolar memory layer M1, the intermediate electrode N1, and the second bipolar memory layer M2 may be sequentially stacked between the first electrode E1 and the second electrode E2.

The first and second bipolar memory layers M1 and M2 may have opposite programming directions. For example, when set and reset voltages of the first bipolar memory layer M1 are positive and negative voltages, respectively, set and reset voltages of the second bipolar memory layer M2 may be negative and positive voltages, respectively. In this case, the reset voltage of the second bipolar memory layer M2 may be greater than, or equal to, the set voltage of the first bipolar memory layer M1, and the set voltage of the second bipolar memory layer M2 may be greater than, or equal to, the reset voltage of the first bipolar memory layer M1.

An absolute value of the reset voltage of the first bipolar memory layer M1 may be greater than, or equal to, that of the set voltage of the first bipolar memory layer M1, and an absolute value of the reset voltage of the second bipolar memory layer M2 may be greater than, or equal to, that of the set voltage of the second bipolar memory layer M2. As such, when a single bipolar memory cell is formed by connecting the two first and second bipolar memory layers M1 and M2 having opposite programming directions, the bipolar memory cell may have a bipolar memory characteristic and a bidirectional (two-way) switching characteristic, which will be described in detail later.

The first and second bipolar memory layers M1 and M2 may be a resistive memory element. In this case, the first and second bipolar memory layers M1 and M2 may include an oxide resistor. The oxide resistor may be a metal oxide resistor, or a variable resistor of which resistance varies with an applied voltage. In detail, at least one of the first and second bipolar memory layers M1 and M2 may be formed of at least one material selected from the group consisting of Ti oxide, Ni oxide, Cu oxide, Co oxide, Hf oxide, Zr oxide, Zn oxide, W oxide, Nb oxide, Ti—Ni oxide, Li—Ni oxide, Al oxide, In—Zn oxide, V oxide, Sr—Zr oxide, Sr—Ti oxide, Cr oxide, Fe oxide, Ta oxide and combinations thereof. These materials may have a unipolar or bipolar characteristic depending on a formation condition. In the example embodiments, it is considered that these materials have bipolar characteristics. Materials of the first and second bipolar memory layers M1 and M2 are not limited to the above materials. For example, the first and second bipolar memory layers M1 and M2 may be formed of Pr—Ca—Mn—O (PCMO) and other material(s) having a bipolar characteristic, or may include at least one material selected from the group consisting Pr—Ca—Mn—O and other bipolar materials.

The first and second electrodes E1 and E2 may be formed of an electrode material that is generally used in a semiconductor device field, and may have a single- or multi-layer structure. For example, the first and second electrodes E1 and E2 may include one material selected from the group consisting of platinum (Pt), gold (Au), palladium (Pd), iridium (Ir), silver (Ag), nickel (Ni), aluminum (Al), molybdenum (Mo), copper (Cu) and combinations thereof. Materials and structures of the first and second electrodes E1 and E2 may be the same or different. The intermediate electrode N1 may be formed of an electrode material that is generally used in a semiconductor device field. Similar to the first and second electrodes E1 and E2, the intermediate electrode N1 may have a single- or multi-layer structure. For example, the intermediate electrode N1 may include one material selected from the group consisting of Pt, Au, Pd, Ir, Ag, Ni, Al, Mo, Cu and combinations thereof. The intermediate electrode N1 may be formed of a material that is the same as, or different from, the materials of the first and second electrodes E1 and E2.

A programming voltage may be applied between the first electrode E1 and the second electrode E2, and the intermediate electrode N1 may be a floating electrode.

Various methods of allowing the first and second bipolar memory layers M1 and M2 to have opposite programming directions may be used. For example, the intermediate electrode N1 and the first and second electrodes E1 and E2 may be formed of different materials. In this case, the intermediate electrode N1 may be an ion source layer including an ion source material. In this instance, the intermediate electrode N1 is an upper electrode with respect to the first bipolar memory layer M1 and is a lower electrode with respect to the second bipolar memory layer M2. Accordingly, when negative and positive voltages are respectively applied to the first and second electrodes E1 and E2, a positive voltage may be applied to the intermediate electrode N1 with respect to the first bipolar memory layer M1, and a negative voltage may be applied to the intermediate electrode N1 with respect to the second bipolar memory layer M2. That is, voltages that are respectively applied to the intermediate electrode N1, which is an ion source layer with respect to the first bipolar memory layer M1, and to the intermediate electrode N1, which is an ion source layer with respect to the second bipolar memory layer M2, have opposite signs. Because the programming direction may be determined depending on a voltage applied to the ion source layer (the intermediate electrode N1), the first and second bipolar memory layers M1 and M2 may have opposite programming directions. At this point, the first bipolar memory layer M1 and the second bipolar memory layer M2 may be the same layer having a single-layer structure. In detail, the bipolar memory cell may have a Pt/PCMO/Cu/PCMO/Pt structure. In this regard, a Pt layer is the first and second electrode E1 and E2, a Cu layer (ion source layer) is the intermediate electrode N1, and a PCMO layer is the first and second bipolar memory layers M1 and M2.

The first and second bipolar memory layers M1 and M2 may have a multi-layer structure. In this instance, the two first and second bipolar memory layers M1 and M2 may have the same stacked structure.

Alternatively, the first and second electrodes E1 and E2, instead of the intermediate electrode N1, may be formed as an ion source layer. Even in this case, voltages that are respectively applied to the first electrode E1, which is an ion source layer with respect to the first bipolar memory layer M1, and to the second electrode E2, which is an ion source layer with respect to the second bipolar memory layer M2, have opposite signs. Accordingly, the first and second bipolar memory layers M1 and M2 may have opposite programming directions. For example, the bipolar memory cell may have a Cu/PCMO/Pt/PCMO/Cu structure. In this regard, a Cu layer (ion source layer) is the first and second electrodes E1 and E2, and a Pt layer is the intermediate electrode N1. The first and second bipolar memory layers M1 and M2 may also have opposite programming directions by using other various methods. For example, if the first and second bipolar memory layers M1 and M2 are formed to have a multi-layer structure, but if the second bipolar memory layer M2 has an inversed structure with respect to the first bipolar memory layer M1, the programming directions of the first and second bipolar memory layers M1 and M2 may be opposite to each other, which will be described below with reference to FIGS. 2 and 3.

Figure 2:
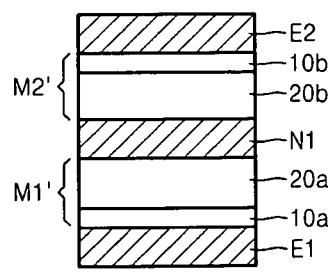

FIG. 2 is a cross-sectional view illustrating a bipolar memory cell according to example embodiments.

Referring to FIG. 2, a first bipolar memory layer M1' may have a structure in which a first active layer 10a and a first base layer 20a are sequentially stacked. A second bipolar memory layer M2' may have a structure in which a second base layer 20b and a second active layer 10b are sequentially stacked. The first active layer 10a may be disposed between a first electrode E1 and the first base layer 20a, and the second active layer 10b may be disposed between the second base layer 20b and a second electrode E2. The first base layer 20a and the first active layer 10a may be formed of an oxide of the same group. Similarly, the second base layer 20b and the second active layer 10b may be formed of an oxide of the same group. The first bipolar memory layer M1' and the second bipolar memory layer M2' may be formed of an oxide of the same group. The second active layer 10b may be formed of a material that is the same as the first active layer 10a, and the second base layer 20b may be formed of a material that is the same as the first base layer 20a. In this case, the second bipolar memory layer M2' may have a structure in which the first bipolar memory layer M1' is inversed up and down (i.e., an inversed structure).

The first and second active layers 10a and 10b may have an oxygen concentration that is higher than those of the first and second base layers 20a and 20b. The first and second active layers 10a and 10b may have a stoichiometric composition, or a composition close to the stoichiometric composition. For example, when the first and second base layers 20a and 20b is a $TaO_x$ layer, wherein x<2.5, the first and second active layers 10a and 10b may be a $Ta_2O_5$ layer. Materials of the first and second base layers 20a and 20b and the first and second active layers 10a and 10b are not limited to Ta oxide, and thus may be other various materials. For example, the first and second base layers 20a and 20b and the first and second active layers 10a and 10b may be formed of other various oxides (e.g., Ti oxide or Zr oxide). In the present example embodiment, a case where the first bipolar memory layer M1' and the second bipolar memory layer M2' are formed of an oxide of the same group has been described, but the first bipolar memory layer M1' and the second bipolar memory layer M2' may be formed of an oxide of a different group. In addition, the first and second base layers 20a and 20b and the first and second active layers 10a and 10b may be formed of an oxide of a different group. Resistance change characteristics of the first and second bipolar memory layers M1' and M2' may be determined by the first and second active layers 10a and 10b rather than the first and second base layers 20a and 20b.

The first and second base layers 20a and 20b may have a thickness of several to several hundreds of nanometers (nm) (e.g., several tens of nm). The first and second active layers 10a and 10b may have a thickness of several nm, for example, less than about 5 nm.

As illustrated in FIG. 2, when the second bipolar memory layer M2' has an inversed structure of the first bipolar memory layer M1', the first and second bipolar memory layers M1' and M2' may have opposite programming directions. In this case, there is no need to form the intermediate electrode N1, or the first and second electrodes E1 and E2, as an ion source layer. Thus, the first and second electrodes E1 and E2 and the intermediate electrode N1 may be formed of the same material.

Figure 3:
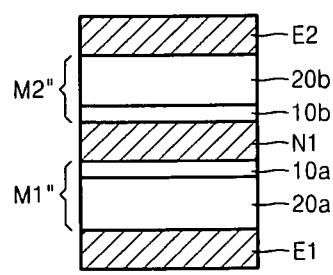

In FIG. 2, the positions of the first active layer 10a and the first base layer 20a may be inversed, and the positions of the second base layer 20b and the second active layer 10b may also be inversed as illustrated in FIG. 3.

Referring to FIG. 3, the first active layer 10a may be disposed between the first base layer 20a and the intermediate electrode N1, and the second active layer 10b may be disposed between the second base layer 20b and the intermediate electrode N1. In this case, a second bipolar memory layer M2'' may have an inversed structure of a first bipolar memory layer M1''. Thus, the first and second bipolar memory layers M1'' and M2'' may have opposite programming directions.

Figure 4:
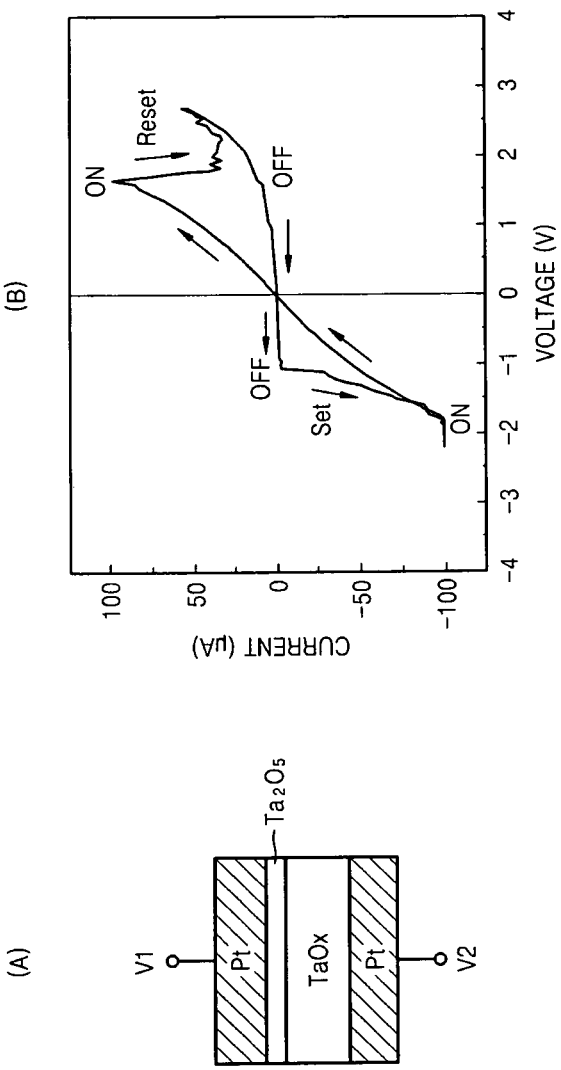
FIG. 4A is a cross-sectional view illustrating a memory element having a $Pt/TaO_x/Ta_2O_5/Pt$ structure according to example embodiments.
FIG. 4B is a graph illustrating a voltage-current characteristic of the memory element of FIG. 4A.
Figure 5:
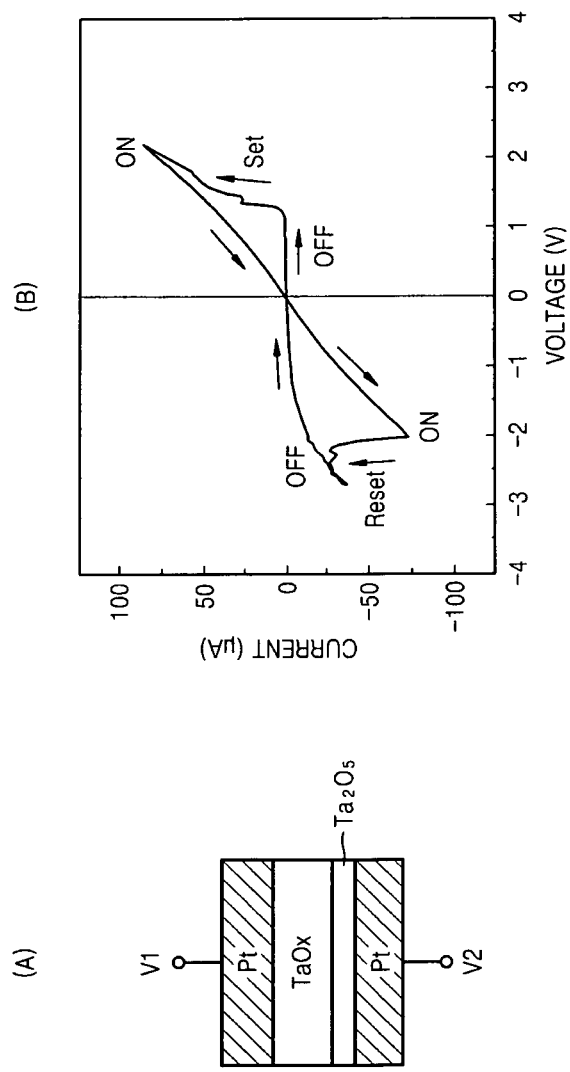
FIG. 5A is a cross-sectional view illustrating a memory element having a $Pt/Ta_2O_5/TaO_x/Pt$ structure according to example embodiments.
FIG. 5B is a graph illustrating a voltage-current characteristic of the memory element of FIG. 5A.
Figure 6:
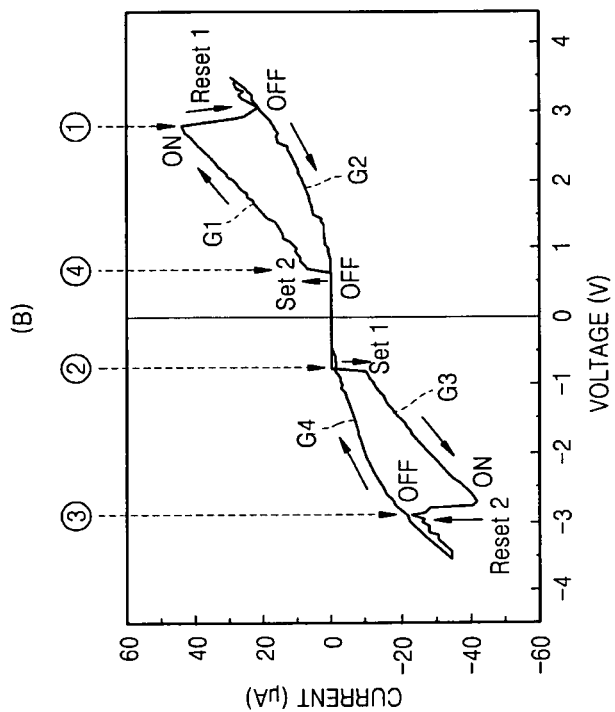
FIG. 6A is a cross-sectional view illustrating a bipolar memory cell having a $Pt/Ta_2O_5/TaO_x/Pt/TaO_x/Ta_2O_5/Pt$ structure according to example embodiments.
FIG. 6B is a graph illustrating a voltage-current characteristic of the a bipolar memory cell of FIG. 6A.
Figure 6:
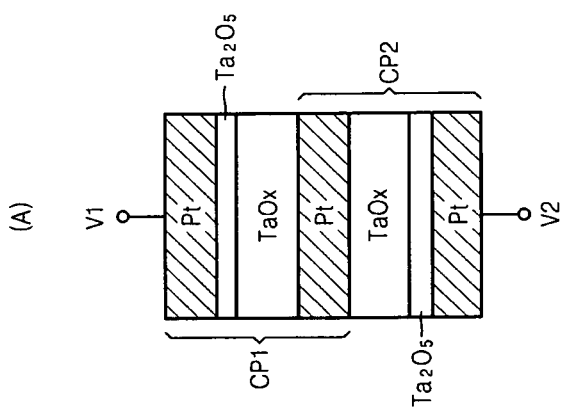

As described above, the bipolar memory cell in which two bipolar memory layers are connected to have opposite programming directions may have a bipolar memory characteristic and a bidirectional (two-way) switching characteristic. That is, even though an additional switching element is not formed, the same effect as if a bidirectional (two-way) switching element is formed is achieved, which will be described in detail with reference to FIGS. 4 through 6.

FIG. 4A is a cross-sectional view illustrating a memory element having a Pt/$TaO_x$/$Ta_2O_5$/Pt structure, and FIG. 4B is a graph illustrating a voltage-current characteristic of the Pt/$TaO_x$/$Ta_2O_5$/Pt structure of FIG. 4A.

In a $TaO_x$ layer, x is smaller than 2.5. That is, an oxygen concentration of the $TaO_x$ layer is smaller that that of a $Ta_2O_5$ layer, and this is the same as in FIGS. 5A and 6A. In FIG. 4B, a voltage V is a value obtained by subtracting a voltage V2 applied to a lower Pt of FIG. 4A from a voltage V1 applied to an upper Pt of FIG. 4A. When the voltage V2 applied to the lower Pt is 0 V, the voltage V of FIG. 4B is the same as the voltage V1 applied to the upper Pt.

Referring to FIGS. 4A and 4B, the Pt/$TaO_x$/$Ta_2O_5$/Pt structure shows a voltage-current characteristic of a bipolar memory element. At this point, a reset voltage is a positive voltage, and a set voltage is a negative voltage. When the reset voltage is applied to the bipolar memory element, the Pt/$TaO_x$/$Ta_2O_5$/Pt structure is changed from a low resistance state (i.e., an ON state) into a high resistance state (i.e., an OFF state). When the set voltage is applied to the bipolar memory element, the Pt/$TaO_x$/$Ta_2O_5$/Pt structure is changed from a high resistance state (i.e., an OFF state) into a low resistance state (i.e., an ON state).

FIG. 5A is a cross-sectional view illustrating a memory element having a Pt/$Ta_2O_5$/$TaO_x$/Pt structure, and FIG. 5B is a graph illustrating a voltage-current characteristic of the Pt/$Ta_2O_5$/$TaO_x$/Pt structure of FIG. 5A.

In FIG. 5B, a voltage V is a value obtained by subtracting a voltage V2 applied to a lower Pt of FIG. 5A from a voltage V1 applied to an upper Pt of FIG. 5A.

In the Pt/$Ta_2O_5$/$TaO_x$/Pt structure of FIG. 5A, the positions of a $TaO_x$ layer and a $Ta_2O_5$ layer of FIG. 4A are inversed. FIG. 5B shows a voltage-current characteristic of a bipolar memory element (similar to FIG. 4B), but the positions of a reset voltage and a set voltage are inversed. That is, in FIG. 5B, the reset voltage is a negative voltage, and the set voltage is a positive voltage. As the positions of the $TaO_x$ layer and the $Ta_2O_5$ layer are inversed in FIG. 4A, the positions (signs) of the set voltage and the reset voltage are inversed. The structures of the memory elements of FIG. 4A and FIG. 5A may have opposite programming directions.

FIG. 6A is a cross-sectional view illustrating a bipolar memory cell having a Pt/Ta$_2$O$_5$/TaO$_x$/Pt/TaO$_x$/Ta$_2$O$_5$/Pt structure. That is, the Pt/Ta$_2$O$_5$/TaO$_x$/Pt/TaO$_x$/Ta$_2$O$_5$/Pt structure of FIG. 6A is a structure in which the Pt/TaO$_x$/Ta$_2$O$_5$/Pt structure of FIG. 4A and the Pt/Ta$_2$O$_5$/TaO$_x$/Pt structure of FIG. 5A are connected to each other. At this point, a lower Ta$_2$O$_5$/TaO$_x$ and an upper TaO$_x$/Ta$_2$O$_5$ share the intermediate electrode Pt. This structure is an example of a bipolar memory cell according to example embodiments. Hereinafter, a region from an upper Pt to the intermediate Pt is referred to as an upper cell portion CP1, and a region from the intermediate Pt to a lower Pt is referred to as a lower cell portion CP2. The upper cell portion CP1 corresponds to the Pt/TaO$_x$/Ta$_2$O$_5$/Pt structure of FIG. 4A, and the lower cell portion CP2 corresponds to the Pt/Ta$_2$O$_5$/TaO$_x$/Pt structure of FIG. 5A.

FIG. 6B is a graph illustrating a voltage-current characteristic of the Pt/Ta$_2$O$_5$/TaO$_x$/Pt/TaO$_x$/Ta$_2$O$_5$/Pt structure of FIG. 6A.

In FIG. 6B, a voltage V is a value obtained by subtracting a voltage V2 applied to the lower Pt of FIG. 6A from a voltage V1 applied to the upper Pt of FIG. 6A. An additional voltage is not applied to the intermediate Pt. That is, the intermediate Pt is floated. The following description about FIG. 6B includes a description about a method of operating a bipolar memory according to example embodiments.

Referring to FIGS. 6A and 6B, it is seen that the Pt/Ta$_2$O$_5$/TaO$_x$/Pt/TaO$_x$/Ta$_2$O$_5$/Pt structure shows both a bipolar memory characteristic and a bidirectional (two-way) switching characteristic. The Pt/Ta$_2$O$_5$/TaO$_x$/Pt/TaO$_x$/Ta$_2$O$_5$/Pt structure shows a rectification characteristic and a bipolar memory characteristic in two-way based on 0 V. Points ① and ② respectively correspond to a first reset (Reset 1) and a first set (Set 1), and points ③ and ④ respectively correspond to a second reset (Reset 2) and a second set (Set 2). Current hardly flows between the point ② and the point ④. The points ② and ④ may respectively correspond to the first set (Set 1) and the second set (Set 2), and may also respectively correspond to a first threshold voltage and a second threshold voltage.

A write voltage may be determined near the point ① or ③, and a read voltage may be determined between the points ① and ④ or between the points ② and ③. A region where a current does not substantially flow between the points ② and ④ may be an inhibition region. The inhibition region may be a window for a normal memory operation. In detail, when an operating current for reading/writing/erasing is applied to a set memory cell, a voltage corresponding to the inhibition region is applied to the other memory cells, thereby preventing the operating current from flowing to an undesired path. Thus, a normal memory operation is possible, and the other memory cells may maintain their original states. The inhibition region is generally formed by using a bidirectional (two-way) switching element. However, in the present example embodiments, two bipolar memory elements having opposite programming directions are connected, and thus, even though an additional switching element is not formed, the same effect as if a bidirectional (two-way) switching element is formed is achieved.

As described above, a conventional memory cell is formed by connecting a memory element and a switching element. In this case, because the memory element and the switching element have different individual characteristics, it may be difficult to match the two characteristics. Such a difficulty may become more serious as a device is highly integrated. For example, with regard to a highly-integrated device, in order to obtain a normal resistance change characteristic of a memory element, a forward current density of the switching element needs to be increased by increasing a size (width) of the switching element, thereby enabling programming of the memory element. As such, when the size (width) of the switching element needs to be increased, the scale down of a memory device may be difficult and the manufacturing process may not be easy. However, according to example embodiments, because two bipolar memory elements having opposite programming directions are connected to each other, even though an additional switching element is not formed, the same effect as if a switching element is formed is achieved. Thus, a burden for satisfying the requirements of the switching element may be significantly reduced. Consequently, it may be easier to develop a highly-integrated memory device.

Hereinafter, set and reset processes of FIG. 6B will be described in detail.

In first through fourth plots G1 through G4 of FIG. 6B, states of the upper cell portion CP1 and the lower cell portion CP2 may be shown in Table 1 below.

TABLE 1

|  | G1 | G2 | G3 | G4 |
|---|---|---|---|---|
| UPPER CELL CP1 | ON | OFF | ON | ON |
| LOWER CELL CP2 | ON | ON | ON | OFF |

When both the upper cell portion CP1 and the lower cell portion CP2 are in an ON state and when a voltage is increased in a positive (+) direction from 0 V, a voltage-current characteristic follows the first plot G1. When a first reset voltage is applied, the voltage-current characteristic may follow the second plot G2. This is a first reset (Reset 1) operation. At this point, the upper cell portion CP1 may be changed into an OFF state. In this state, when the voltage is increased in a negative (−) direction, the upper cell portion CP1 may be changed into an ON state at a first set voltage. This is a first set (Set 1) operation, and the voltage-current characteristic may follow the third plot G3. When the voltage is further increased in the negative (−) direction, the lower cell portion CP2 may be changed into an OFF state at a second reset voltage. This is a second reset (Reset 2) operation, and the voltage-current characteristic may follow the fourth plot G4. In this state, when the voltage is increased in a positive (+) direction again, the lower cell portion CP2 may be changed into an ON state at a second set voltage. This is a second set (Set 2) operation, and the voltage-current characteristic may follow the first plot G1.

The first reset (Reset 1) is an operation in which the upper cell portion CP1 is reset and which is similar to the reset operation of FIG. 4B. However, the first reset voltage may be greater than the reset voltage of FIG. 4B because the upper cell portion CP1 and the lower cell portion CP2 are connected to each other in series in FIG. 6A. Thus, when both of them are in an ON state, a voltage is separately dispersed into the upper cell portion CP1 and the lower cell portion CP2. Accordingly, a voltage required to reset the upper cell portion CP1 in FIG. 6A may be greater than that required to reset the structure of FIG. 4A. The first set (Set 1) is an operation in which the upper cell portion CP1 is set and which is similar to the set of FIG. 4B. The first set voltage may be similar to the set voltage of FIG. 4B because the first set (Set 1) operation is performed when the upper cell portion CP1 and the lower cell portion CP2 are in an OFF state and an ON state, respectively. Thus, the voltage is concentrated in the upper cell portion CP1, which is in a high resistance state.

The second reset (Reset 2) is an operation in which the lower cell portion CP2 is reset and which may be similar to the reset operation of FIG. 5B. An absolute value of the second reset voltage may be greater than that of the reset voltage of FIG. 5B, because the above-described first reset voltage is greater than the reset voltage of FIG. 4B. The second set (Set 2) is an operation in which the lower cell portion CP2 is set and which may be similar to the set operation of FIG. 5B. The second set voltage may be similar to the set voltage of FIG. 5B because the above-described first set voltage is similar to the set voltage of FIG. 4B.

When the reset voltage of FIG. 4B is greater than, or equal to, the set voltage of FIG. 5B and when the set voltage of FIG. 5B is greater than, or equal to, the reset voltage of FIG. 4B, the graph of FIG. 6B may be easily obtained. In addition, when the absolute value of the reset voltage of FIG. 4B is greater than, or equal to, that of the set voltage thereof and when the absolute value of the reset voltage of FIG. 5B is greater than, or equal to, that of the set voltage thereof, the graph of FIG. 6B may be easily obtained. In FIGS. 1 through 3, when set voltages and reset voltages of the first bipolar memory layers M1, M1' and M1" are positive voltages and negative voltages, respectively, and when set voltages and reset voltages of the second bipolar memory layers M2, M2' and M2" are negative voltages and positive voltages respectively, the reset voltages of the second bipolar memory layers M2, M2' and M2" may be greater than, or equal to, the set voltages of the first bipolar memory layers M1, M1' and M1", and the set voltages of the second bipolar memory layers M2, M2' and M2" may be greater than, or equal to, the reset voltages of the first bipolar memory layers M1, M1' and M1". In addition, absolute values of the reset voltages of the second bipolar memory layers M2, M2' and M2" may be greater than, or equal to, those of the set voltages thereof, and absolute values of the reset voltages of the first bipolar memory layers M1, M1' and M1" may be greater than, or equal to, those of the set voltages thereof.

However, as described above, because the first reset voltage of FIG. 6B is greater than the reset voltage of FIG. 4B, even when the reset voltage of FIG. 4B is smaller than the set voltage of FIG. 5B, a characteristic similar to that of the plots G1 and G2 on the right of FIG. 6B may be obtained by connecting the structures of FIGS. 4A and 5A. Similarly, even when the set voltage of FIG. 4B is smaller than the reset voltage of FIG. 5B, a characteristic similar to the plots G3 and G4 on the left of FIG. 6B may be obtained by connecting the structures of FIGS. 4A and 5A. Accordingly, in FIGS. 1 through 3, when the set voltages and the reset voltages of the first bipolar memory layers M1, M1' and M1" are positive voltages and negative voltages, respectively, and when the set voltages and the reset voltage of the second bipolar memory layers M2, M2' and M2" are negative voltages and positive voltages respectively, the reset voltages of the second bipolar memory layers M2, M2' and M2" may be smaller than the set voltages of the first bipolar memory layers M1, M1' and M1", and the set voltages of the second bipolar memory layers M2, M2' and M2" may be smaller than the reset voltages of the first bipolar memory layers M1, M1' and M1". In addition, absolute values of the reset voltages of the second bipolar memory layers M2, M2' and M2" may be smaller than those of the set voltages thereof, and absolute values of the reset voltages of the first bipolar memory layers M1, M1' and M1" may be smaller than those of the set voltages thereof.

Figure 7:
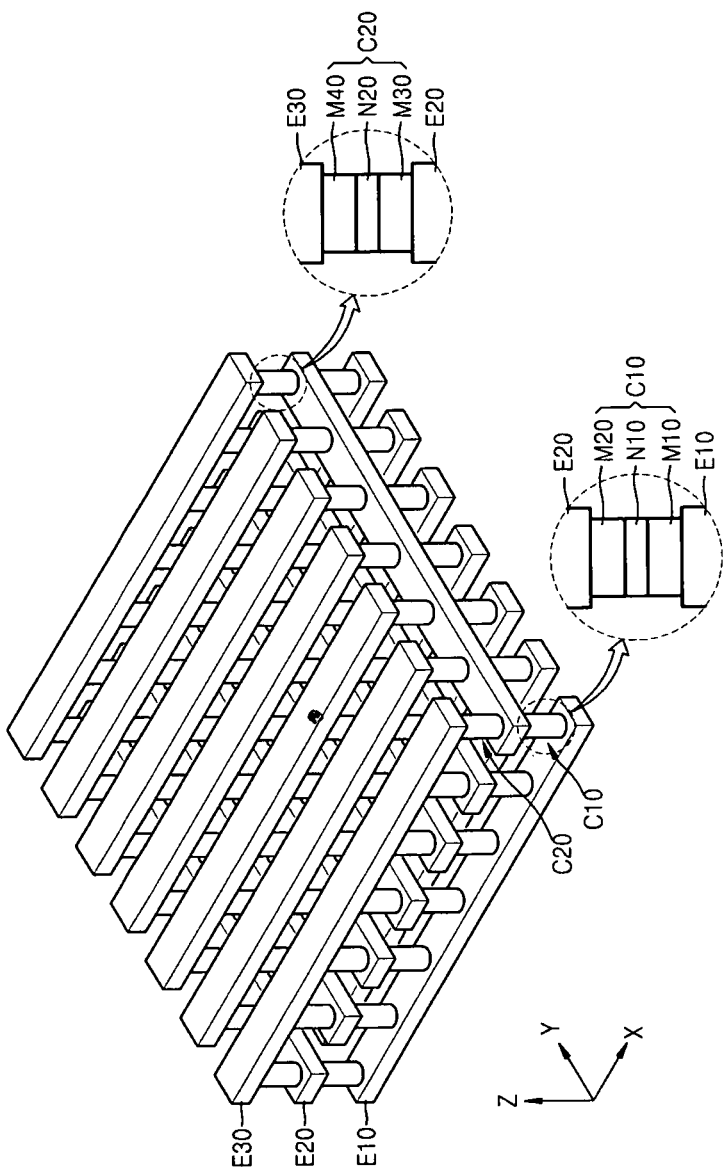
FIG. 7 is a perspective view illustrating a memory device according to example embodiments.

FIG. 7 is a perspective view illustrating a memory device including a memory cell according to example embodiments.

The memory device of the present example embodiment is a multi-layer cross-point memory device. However, example embodiments are not limited thereto.

Referring to FIG. 7, a plurality of first electrodes E10 having a wire shape may be aligned in parallel to each other. The first electrode E10 may extend in a first direction, for example, in an x-axis direction. A plurality of second electrodes E20 having a wire shape may be aligned in parallel to each other so as to be spaced apart from the plurality of first electrodes E10. The second electrode E20 and the first electrode E10 may cross each other. For example, the second electrode E20 and the first electrode E10 may be aligned perpendicular to each other. In this case, the second electrode E20 may extend in the y-axis direction as illustrated in FIG. 7. The directions of the first and second electrodes E10 and E20 may be inversed, and the shapes of the first and second electrodes E10 and E20 may be modified in various ways.

The first and second electrodes E10 and E20 may be formed of an electrode material that is generally used in a semiconductor device field, and may be formed in a single- or multi-layer structure. For example, the first and second electrodes E10 and E20 may include at least one material selected from the group consisting of Pt, Au, Pd, Ir, Ag, Ni, Al, Mo, Cu and combinations thereof. Materials used to form the first and second electrodes E10 and E20 and the configurations thereof may be the same or different. The first and second electrodes E10 and E20 may correspond to the first and second electrodes E1 and E2 of FIGS. 1 through 3.

A first memory cell C10 may be positioned at each cross-point between the first electrodes E10 and the second electrodes E20. The first memory cell C10 may include a first bipolar memory layer M10, a first intermediate electrode N10 and a second bipolar memory layer M20 that are sequentially stacked. The first bipolar memory layer M10, the first intermediate electrode N10 and the second bipolar memory layer M20 may correspond to the first bipolar memory layers M1, M1' and M1", the intermediate electrode N1, and the second bipolar memory layers M2, M2' and M2" of FIGS. 1 through 3. Thus, programming directions of the first bipolar memory layer M10 and the second bipolar memory layer M20 may be opposite.

A plurality of third electrodes E30 may be aligned so as to be spaced apart from an upper surface of the second electrode E20 at a set interval. The plurality of third electrodes E30 having a wire shape may be aligned parallel to each other. The third electrode E30 and the second electrode E20 may cross each other. A material used to form the third electrode E30 may be the same as those used to form the first and second electrodes E10 and E20. A second memory cell C20 may be positioned at each cross-point between the second electrodes E20 and the third electrodes E30. The second memory cell C20 may include a third bipolar memory layer M30, a second intermediate electrode N20 and a fourth bipolar memory layer M40 that are sequentially stacked on the second electrode E20. The third bipolar memory layer M30 and the fourth bipolar memory layer M40 may have a programming direction that is the same as those of the first and second bipolar memory layers M10 and M20. In this case, the second memory cell C20 may have a stacked structure that is the same as that of the first memory cell C10. Alternatively, the third and fourth bipolar memory layers M30 and M40 may have a programming direction that is opposite to those of the first and second bipolar memory layers M10 and M20. The second intermediate electrode N20 may be the same as, or similar to, the first intermediate electrode N10.

Even though the first and second memory cells C10 and C20 of FIG. 7 have a cylindrical shape, they may also have other various shapes (e.g., a square pillar shape or a pillar shape of which width increases downward). For example, the first and second memory cells C10 and C20 may externally extend from the cross-points between the first and second electrodes E10 and E20 and between the second and third electrodes E20 and E30.

Although it is not shown in FIG. 7, the memory device of FIG. 7 may further include a stacked structure that is the same as the stacked structure that includes the first memory cell C10 and the second electrode E20, on the third electrode E30.

Alternatively, the memory device of FIG. 7 may further include at least one set of a stacked structure that is the same as the stacked structure that includes the first memory cell C10, the second electrode E20, the second memory cell C20, and the third electrode E30, on the third electrode E30.

Alternatively, the memory device of FIG. 7 may further include at least one set of a stacked structure that is the same as the stacked structure that includes the first memory cell C10, the second electrode E20, the second memory cell C20, the third electrode E30, the first memory cell C10, and the second electrode E20, which are sequentially stacked, on the third electrode E30.

Figure 8A:
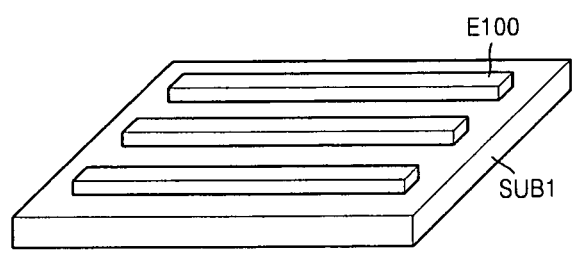
FIGS. 8A through 8C are perspective views illustrating a method of manufacturing a memory device according to example embodiments.
Figure 8B:
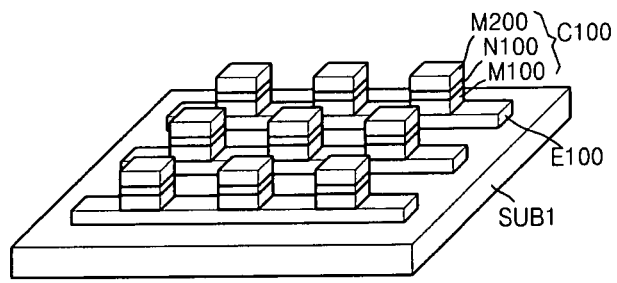
Figure 8C:
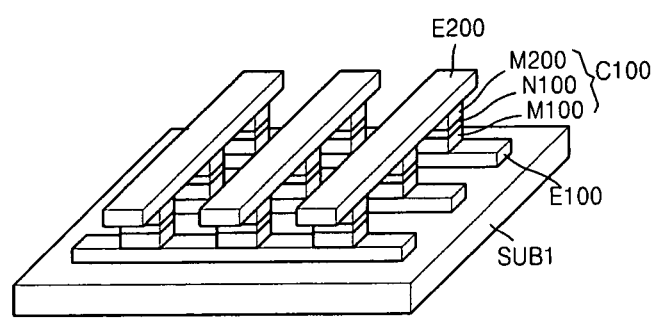

FIGS. 8A through 8C are perspective views for explaining a method of manufacturing a memory device according to example embodiments.

Referring to FIG. 8A, a plurality of first electrodes E100 may be formed on a substrate SUB 1. The plurality of first electrodes E100 may be aligned parallel to each other so as to be spaced apart from each other at regular intervals. Although it is not shown in FIG. 8A, a first insulating layer having a height that is the same as that of the first electrode E100 may be formed around the plurality of first electrodes E100.

Referring to FIG. 8B, a plurality of first memory cells C100 may be respectively formed on the plurality of first electrodes E100. The first memory cell C100 may include a first bipolar memory layer M100, a first intermediate electrode N100 and a second bipolar memory layer M200 that are sequentially stacked. The first bipolar memory layer M100, the first intermediate electrode N100 and the second bipolar memory layer M200 may respectively correspond to the first bipolar memory layers M1, M1' and M1", the intermediate electrode N1, and the second bipolar memory layers M2, M2' and M2" of FIGS. 1 through 3. The plurality of first memory cells C100 may be formed by sequentially forming a first memory material layer, a first electrode material layer and a second memory material layer on the substrate SUB1 and then patterning the stacked layers. Although it is not shown in FIG. 8B, a second insulating layer having a height that is the same as that of the first memory cell C100 may be formed around the plurality of first memory cells C100.

Referring to FIG. 8C, a plurality of second electrodes E200 may be respectively formed on the plurality of first memory cells C100. The plurality of second electrodes E200 and the plurality of first electrodes E100 may cross each other. The first memory cell C100 may be positioned at each cross-point between the first electrodes E100 and the second electrodes E200. Although it is not shown in FIG. 8C, a plurality of second memory cells and third electrodes may further be disposed on the second electrodes E200.

Figure 9A:
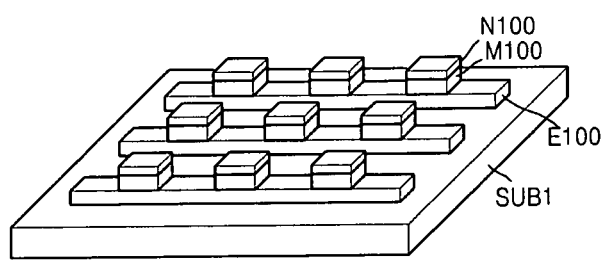
FIGS. 9A through 9C are perspective views illustrating a method of manufacturing a memory device according to example embodiments.
Figure 9B:
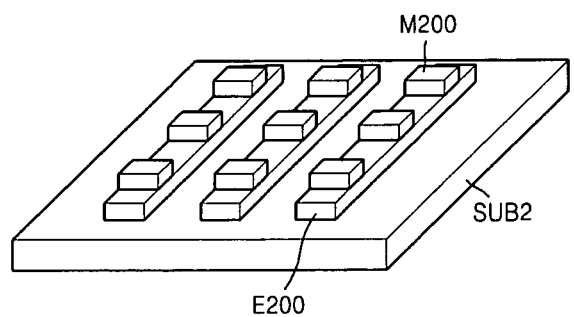
Figure 9C:
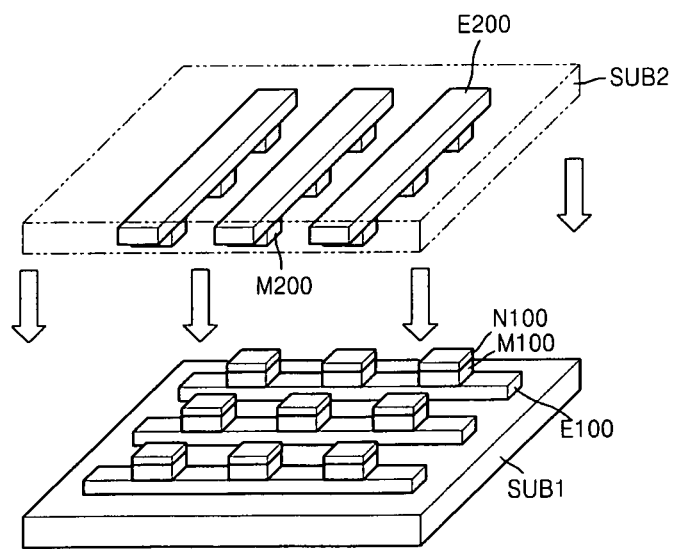

FIGS. 9A through 9C are perspective views for explaining a method of manufacturing a memory device according to example embodiments.

Referring to FIG. 9A, a plurality of first electrodes E100 may be formed on a first substrate SUB1. The plurality of first electrode E100 may be aligned parallel to each other at regular intervals. A first insulating layer (not shown) having a height that is the same as that of the first electrode E100 may be formed around the plurality of first electrodes E100. Next, a plurality of stacked structures in which a first bipolar memory layer M100 and a first intermediate electrode N100 are sequentially stacked may be formed on each of the plurality of first electrodes E100. Each of the plurality of stacked structures may be formed by forming a first memory material layer and a first electrode material layer, and then patterning the stacked layers. A second insulating layer (not shown) having a height that is the same as that of the stacked structure may further be formed around the stacked structure in which the first bipolar memory layer M100 and the first intermediate electrode N100 are sequentially stacked.

Referring to FIG. 9B, a plurality of second electrodes E200 may be formed on a second substrate SUB2. The plurality of second electrodes E200 may be aligned parallel to each other at regular intervals. A third insulating layer (not shown) having a height that is equal to that of second electrode E200 may be formed around the second electrode E200. Next, a plurality of second bipolar memory layers M200 may be formed on each of the plurality of second electrodes E200. A fourth insulating layer (not shown) having a height that is equal to that of the second bipolar memory layer M200 may further be formed around the second bipolar memory layer M200.

Referring to FIG. 9C, the second substrate SUB2 may be turned over and adhered to the first substrate SUB1. At this point, the plurality of first intermediate electrodes N100 of the first substrate SUB1 and the plurality of second bipolar memory layers M200 of the second substrate SUB2 may be adhered to each other. When the second substrate SUB2 is a transparent substrate, an alignment key displayed on the first substrate SUB1 through the second substrate SUB2 may be seen. Thus, the position of the second substrate SUB2 may be adjusted so that each of the plurality of second bipolar memory layers M200 may correspond to each of the plurality of first intermediate electrodes N100. The plurality of second electrodes E200 and the plurality of first electrodes E100 may cross each other, and a first memory cell including the first bipolar memory layer M100, the first intermediate electrode N100 and the second bipolar memory layer M200 that are sequentially stacked may be formed in each cross-point between the plurality of second electrodes E200 and the plurality of first electrodes E100. Although it is not shown in FIG. 9C, the second substrate SUB2 may be removed when necessary. Then, a plurality of second memory cells and third electrodes may further be formed on the second electrodes E200. Alternatively, after forming holes in the second substrate SUB2, a plurality of second memory cells adhered to the second electrodes E200 may be formed in the holes, and then a plurality of third electrodes may be formed on the plurality of second memory cells. Also, a method of manufacturing a memory device according to example embodiments may vary in ways understood by one skilled in the art.

Now, a method of forming the bipolar memory layers according to example embodiments will be described with reference to FIG. 2.

The first and second active layers 10a and 10b of FIG. 2 may be formed by oxidizing an oxide layer that is previously deposited. For example, the second bipolar memory layer M2' having a $TaO_x/Ta_2O_5$ structure may be formed by depositing the $TaO_x$ layer and then oxidizing the surface thereof. The oxidization may be performed by any one method selected from the group consisting of furnace oxidization, rapid thermal annealing (RTA) oxidization, thermal oxidization and plasma oxidization. Alternatively, the oxidization process may be omitted. For example, the second bipolar memory layer M2' having a $TaO_x/Ta_2O_5$ structure may be formed by forming the $TaO_x$ layer and then directly forming the $Ta_2O_5$ layer on the $TaO_x$ layer by chemical vapor deposition (CVD), atomic layer deposition (ALD) or physical vapor deposition (PVD). The first bipolar memory layer M1' having a $Ta_2O_5/TaO_x$ structure may be formed by depositing the $TaO_x$ layer to be thin, changing the entire $TaO_x$ layer into the $Ta_2O_5$ layer through a oxidization process, and then forming the $TaO_x$ layer on the $Ta_2O_5$ layer. Alternatively, the first bipolar memory layer M1' may be formed by directly forming the $Ta_2O_5$ layer by CVD, ALD or PVD and then forming the $TaO_x$ layer thereon. This method may also refer not only to the Ta oxide but also to other oxides. In addition, this method may be used to form the memory layer in FIGS. 8A through 8C and 9A through 9C.

While the present invention has been particularly shown and described with reference to example embodiments thereof using specific terms, the embodiments and terms have been used to explain the present invention and should not be construed as limiting the scope of the present invention defined by the claims. For example, the structures of the memory devices according to example embodiments may be modified in various ways. In detail, the memory cell of FIGS. 1 through 3 may also refer not only to the cross-point memory device of FIG. 7 but also to other various memory devices. In the memory cell according to example embodiments, not only a resistive memory element but also other various memory elements may be used as a bipolar memory element. Therefore, the scope of the invention is defined not by the detailed description of the invention but by the appended claims, and all differences within the scope will be construed as being included in the present invention.

What is claimed is:

1. A memory cell, comprising:
   a first bipolar memory layer, the first bipolar memory layer including a first base layer and a first active layer, both of the first base layer and the first active layer being formed of a first metal oxide; and
   a second bipolar memory layer connected to the first bipolar memory layer, the second bipolar memory layer including a second base layer and a second active layer, both of the second base layer and the second active layer being formed of a second metal oxide;
   a first electrode, the first bipolar memory layer being between the first electrode and the second bipolar memory layer;
   an intermediate electrode between the first and second bipolar memory layers, the first and second base layers contacting the intermediate electrode, or the first and second active layers contacting the intermediate electrode; and
   a second electrode, the second bipolar memory layer being between the second electrode and the first bipolar memory layer,
   wherein the first and second bipolar memory layers are configured to have opposite programming directions such that set and reset voltages of the first bipolar memory layer have signs opposite to set and reset voltages of the second bipolar memory layer, and
   the first and second bipolar memory layers constitute a single memory cell.

2. The memory cell of claim 1, wherein the set and reset voltages of the second bipolar memory layer are positive and negative voltages respectively, and the set and reset voltages of the first bipolar memory layer are negative and positive voltages respectively.

3. The memory cell of claim 2, wherein the reset voltage of the first bipolar memory layer is greater than or equal to the set voltage of the second bipolar memory layer, and the set voltage of the first bipolar memory layer is greater than or equal to the reset voltage of the second bipolar memory layer.

4. The memory cell of claim 2, wherein an absolute value of the reset voltage of the first bipolar memory layer is greater than or equal to that of the set voltage of the first bipolar memory layer, and an absolute value of the reset voltage of the second bipolar memory layer is greater than or equal to that of the set voltage of the second bipolar memory layer.

5. The memory cell of claim 1,
   wherein an oxygen concentration of the first active layer is higher than an oxygen concentration of the first base layer, and
   an oxygen concentration of the second active layer is higher than an oxygen concentration of the second base layer.

6. The memory cell of claim 5, wherein the intermediate electrode is an ion source layer, or the first and second electrodes are ion source layers.

7. The memory cell of claim 5, wherein the first active layer and the second active layer are formed of $Ta_2O_5$, and the first base layer and the second base layer are formed of $TaO_x$, in which x is less than 2.5.

8. The memory cell of claim 1, wherein the intermediate electrode is a floating electrode.

9. A cross-point memory device, comprising:
   a plurality of first electrodes that have a wire shape and are aligned parallel to each other;
   a plurality of second electrodes that have a wire shape and are aligned parallel to each other so as to cross the plurality of first electrodes; and
   a first memory cell at each cross-point between the first electrodes and the second electrodes, wherein the first memory cell is the memory cell according to claim 1, and the first and second bipolar memory layers are sequentially stacked.

10. The cross-point memory device of claim 9, wherein an absolute value of the reset voltage of the first bipolar memory layer is greater than or equal to an absolute value of the set voltage of the second bipolar memory layer, and
   an absolute value of the reset voltage of the second bipolar memory layer is greater than or equal to an absolute value of the set voltage of the first bipolar memory layer.

11. The cross-point memory device of claim 9, wherein the first and second bipolar memory layers have a multi-layer structure, and the second bipolar memory layer has an inversed structure of the first bipolar memory layer.

12. The cross-point memory device of claim 9, wherein the intermediate electrode is an ion source layer, or the first and second electrodes are ion source layers.

13. The cross-point memory device of claim 9, wherein
   an oxygen concentration of the first active layer is higher than an oxygen concentration of the first base layer, and
   an oxygen concentration of the second active layer is higher than an oxygen concentration of the second base layer.

14. The cross-point memory device of claim 13, wherein the first active layer and the second active layer are formed of $Ta_2O_5$, and the first base layer and the second base layer are formed of $TaO_x$, in which x is less than 2.5.

15. The cross-point memory device of claim 9, wherein the first memory cell has a bi-directional switching characteristic, and the cross-point memory device is configured to operate without an additional element having a switching characteristic.

16. The cross-point memory device of claim 9, further comprising:
   a plurality of third electrodes that have a wire shape and are aligned parallel to each other so as to cross the plurality of second electrodes; and a second memory cell at each cross-point between the second electrodes and the third electrodes, wherein the second memory cell includes a third and a fourth bipolar memory layer that are sequentially stacked and that have opposite programming directions.

17. The cross-point memory device of claim 16, wherein the first memory cell and the second memory cell each have a bi-directional switching characteristic, and the cross-point memory device is configured to operate without an additional element having a switching characteristic.

* * * * *